United States Patent
Yang et al.

(10) Patent No.: US 8,901,711 B1
(45) Date of Patent: Dec. 2, 2014

(54) HORIZONTAL METAL-INSULATOR-METAL CAPACITOR

(71) Applicant: International Business Machines Corporation, Armonk, NY (US)

(72) Inventors: Chih-Chao Yang, Glenmont, NY (US); Juntao Li, Guilderland, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/961,553

(22) Filed: Aug. 7, 2013

(51) Int. Cl.
*H01L 21/02* (2006.01)
*H01L 49/02* (2006.01)

(52) U.S. Cl.
CPC .............. *H01L 28/75* (2013.01); *H01L 28/65* (2013.01)
USPC ........................................................ 257/534

(58) Field of Classification Search
CPC ................................ H01L 28/65; H01L 28/75
USPC ........................................................ 257/534
See application file for complete search history.

(56) References Cited

U.S. PATENT DOCUMENTS

| | | | |
|---|---|---|---|
| 5,675,184 A | 10/1997 | Matsubayashi et al. | |
| 5,879,985 A | 3/1999 | Gambino et al. | |
| 6,461,914 B1 | 10/2002 | Roberts et al. | |
| 6,670,237 B1 | 12/2003 | Loh et al. | |
| 6,764,915 B2 | 7/2004 | Lee | |
| 6,960,365 B2 | 11/2005 | Ning | |
| 7,635,908 B2 | 12/2009 | Barth et al. | |
| 7,768,055 B2 | 8/2010 | Chinthakindi et al. | |
| 2004/0036051 A1* | 2/2004 | Sneh .............................. | 251/301 |
| 2004/0108587 A1 | 6/2004 | Chudzik et al. | |
| 2004/0164339 A1 | 8/2004 | Felsner et al. | |

FOREIGN PATENT DOCUMENTS

DE 10206918 8/2003

OTHER PUBLICATIONS

Jeannot, S., et al., "Toward next high performances MIM generation: up to 30fF/um2 with 3D architecture and high-k materials", Electron Devices Meeting, Dec. 10-12, 2007, IEDM 2007, IEEE International, pp. 997-1000.

* cited by examiner

*Primary Examiner* — Telly Green
*Assistant Examiner* — Paul Patton
(74) *Attorney, Agent, or Firm* — Scully, Scott, Murphy & Presser, P.C.; Catherine Ivers, Esq.

(57) ABSTRACT

A horizontal metal-insulator-metal capacitor including a first metal spacer and a second metal spacer laterally separated by a dielectric material portion is provided within a single opening within at least one layer of dielectric material. A diffusion barrier material portion laterally separates sidewall surfaces of each metal spacer from a corresponding sidewall surface of the at least one layer of dielectric material provided by the opening. Each diffusion barrier material portion, each metal spacer and the dielectric material portion within the opening containing the horizontal metal-insulator-metal capacitor has a bottommost surface that is in contact with a recessed surface of the at least one layer of dielectric material.

19 Claims, 4 Drawing Sheets

HORIZONTAL METAL-INSULATOR-METAL CAPACITOR

BACKGROUND

The present application relates to a semiconductor structure and a method of forming the same. More particularly, the present application relates to a horizontal metal-insulator-metal (MIM) capacitor that is located within a same level as that of a back-end-of-the-line (BEOL) structure, and a method of forming such a MIM capacitor.

Capacitors are used extensively in electronic devices for storing an electric charge. Capacitors essentially comprise two conductive plates separated by an insulator. Capacitors can be used, for example, in filters, analog-to-digital converters, memory devices, various control applications, and mixed signal and analog devices.

There is a demand in semiconductor device technology to integrate many different functions on a single chip, e.g., manufacturing analog and digital circuitry on the same die. Metal-insulator-metal (MIM) capacitors are often used in these integrated circuits. A MIM capacitor is a particular type of capacitor which typically includes two metal plates sandwiched around a capacitor dielectric that is parallel to a surface of a semiconductor substrate. MIM capacitors are generally large in size, being several hundred micrometers wide, for example, depending on the capacitance, which is much larger than a transistor or memory cell, for example. MIM capacitors are typically used as decoupling capacitors for microprocessor units (MPU's), RF capacitors in high frequency circuits, and filter and analog capacitors in mixed-signal products.

To form a conventional MIM capacitor, the top capacitor metal plate is formed by a planar deposition of a conductive material. Next, the deposited conductive material is patterned by lithography and etching providing the top capacitor metal plate. The patterning of the top metal plate requires the use of a mask, and there can be alignment problems to underlying features (e.g., the MIM capacitor bottom plate) and vias to connect to interconnect layers.

Another problem in fabricating MIM capacitors is a restriction in the selection of the MIM dielectric materials, due to potential interaction with or diffusion of the metals (such as copper) used for the metal plates. The MIM dielectric material restriction may result in limited area capacitance.

A yet further problem in forming MIM capacitors is that, in order to avoid problems that arise in fabricating semiconductor devices using copper, often higher resistive plate materials such as, for example, aluminum, titanium nitride, and tungsten, are used for the top and bottom metal plates, which results in reduced high frequency capability. The use of copper, which has a lower resistivity, for the top and bottom metal plates is therefore desired. The use of copper for the top and bottom metal capacitor plates also produces a MIM capacitor having higher quality factors (Q-values).

SUMMARY

A horizontal metal-insulator-metal capacitor including a first metal spacer and a second metal spacer laterally separated by a dielectric material portion is provided within a single opening within at least one layer of dielectric material. A diffusion barrier material portion laterally separates sidewall surfaces of each metal spacer from a corresponding sidewall surface of the at least one layer of dielectric material provided by the opening. Each diffusion barrier material portion, each metal spacer and the dielectric material portion within the opening containing the horizontal metal-insulator-metal capacitor has a bottommost surface that is in direct contact with a recessed surface of the at least one layer of dielectric material.

In one aspect of the present application, a semiconductor structure is provided. The semiconductor structure of the present application includes a horizontal metal-insulator-metal capacitor located within an opening present in at least one layer of dielectric material. The metal-insulator-metal (MIM) capacitor within the opening includes a diffusion barrier material portion present on each sidewall surface of the at least one layer of dielectric material within the opening and in contact with some, but not all, of a recessed surface of the at least one layer of dielectric material within the opening. The MIM capacitor of the present application also includes a metal spacer located on a sidewall surface of each diffusion barrier material portion present within the opening. The MIM capacitor of the present application even further includes a dielectric material portion located between each metal spacer and in direct contact with a sidewall surface of each metal spacer present in the opening.

In another aspect of the present application, a method of forming a semiconductor structure is provided. The method of the present application includes providing at least one opening within at least one layer of dielectric material. Next, a diffusion barrier material portion is formed on each sidewall surface of the at least one layer of dielectric material within each opening and in contact with some, but not all, of a recessed surface of the at least one layer of dielectric material within each opening. A metal spacer is then selectively formed on a sidewall surface of each diffusion barrier material portion present within each opening, wherein each metal spacer in each opening is separated by a gap. The gap is then filled with a dielectric material. An optional planarization process may follow the fill of the gap with the dielectric material.

DETAILED DESCRIPTION

The present application, which provides a horizontal metal-insulator-metal (MIM) capacitor that is located within a same level as that of a back-end-of-the-line (BEOL) structure, and a method of forming such a MIM capacitor, will now be described in greater detail by referring to the following discussion and drawings that accompany the present application. It is noted that the drawings of the present application are provided for illustrative purposes and, as such, they are not drawn to scale. In the drawings and description that follows, like elements are described and referred to by like reference numerals.

In the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present application.

The term "horizontal metal-insulator-metal capacitor" is used throughout the present application to denote a capacitor structure that is located within a single opening provided within an interconnect dielectric material in which a dielectric material portion which serves as an insulator of the MIM capacitor laterally separates one metal plate (a first capacitor metal plate) from another metal plate (a second capacitor metal plate). Stated in other terms, all the MIM capacitor components (i.e., metal plates and insulator) of the horizontal MIM capacitor of the present application are orientated perpendicular, not parallel to the surface of an underlying substrate.

Figure 1:
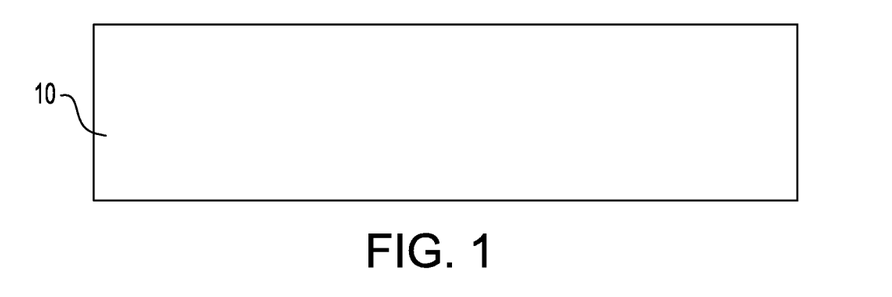
FIG. 1 is a pictorial representation (through a cross sectional view) illustrating an initial structure containing at least one layer of dielectric material that can be employed in an embodiment of the present application.

Referring first to FIG. 1, there is illustrated an initial structure containing at least one layer of dielectric material 10 that can be employed in an embodiment of the present application. The at least one layer of dielectric material 10 may be located upon a substrate (not shown in the drawings of the present application). The substrate, which is not shown, may comprise a semiconducting material, an insulating material, a conductive material or any combination thereof. When the substrate is comprised of a semiconducting material, any semiconducting material such as Si, SiGe, SiGeC, SiC, Ge alloys, GaAs, InAs, InP and other III/V or II/VI compound semiconductors may be used. In addition to these listed types of semiconducting materials, the present application also contemplates cases in which the semiconductor substrate is a layered semiconductor such as, for example, Si/SiGe, Si/SiC, silicon-on-insulators (SOIs) or silicon germanium-on-insulators (SGOIs). When the substrate comprises a semiconducting material, one or more semiconductor devices such as, for example, complementary metal oxide semiconductor (CMOS) devices can be fabricated thereon.

When the substrate is an insulating material, the insulating material can be an organic insulator, an inorganic insulator or a combination thereof including multilayers. When the substrate is a conductive material, the substrate may include, for example, polySi, a conductive metal, alloys of at least two conductive metals, a metal silicide, a metal nitride or combinations thereof including multilayers. When the substrate comprises a combination of an insulating material and a conductive material, the substrate may represent a first interconnect level of a multilayered interconnect structure.

The at least one layer of dielectric material 10 can include any interlevel or intralevel dielectric including inorganic dielectrics or organic dielectrics. In one embodiment, the at least one layer of dielectric material 10 may be non-porous. In another embodiment, the at least one layer of dielectric material 10 may be porous. Porous dielectrics are advantageous since such dielectric materials have lower dielectric constants than an equivalent non-porous dielectric material. Some examples of suitable dielectrics that can be used as the at least one layer of dielectric material 10 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. When a multilayered dielectric material structure is employed as the at least one layer of dielectric material 10, the various dielectric material layers are typically, but not necessarily always, in direct contact with each other.

In one embodiment, each dielectric material within the at least one layer of dielectric material 10 has a dielectric constant that is about 4.0 or less. In another embodiment, each dielectric material within the at least one layer of dielectric material 10 has a dielectric constant of about 2.8 or less. All dielectric constants mentioned herein are relative to a vacuum, unless otherwise noted. The at least one layer of dielectric material 10 that is employed in the present application generally has a lower parasitic crosstalk as compared with dielectric materials that have a dielectric constant of greater than 4.0. The thickness of the at least one layer of dielectric material 10 may vary depending upon the dielectric material used as well as the exact number of dielectrics layers within the at least one layer of dielectric material 10. Typically, and for normal interconnect structures, the at least one layer of dielectric material 10 has a thickness from 50 nm to 1000 nm.

The at least one layer of dielectric material 10 can be formed upon a substrate by utilizing a deposition process such as, for example, chemical vapor deposition, plasma enhanced chemical vapor deposition, spin-on coating, evaporation or chemical solution deposition. In one embodiment, and when more than one dielectric material is present in the at least one layer of dielectric material 10, each dielectric material within the at least one layer of dielectric material 10 can be formed by a same deposition process. In another embodiment, and when more than one dielectric material is present in the at least one layer of dielectric material 10, each dielectric material within the at least one layer of dielectric material 10 can be formed by a different deposition process. In yet another embodiment, and when more than one dielectric material is present in the at least one layer of dielectric material 10, some of the dielectric materials can be formed by a same deposition process, while other dielectric materials can be formed by a different deposition process.

Figure 7:
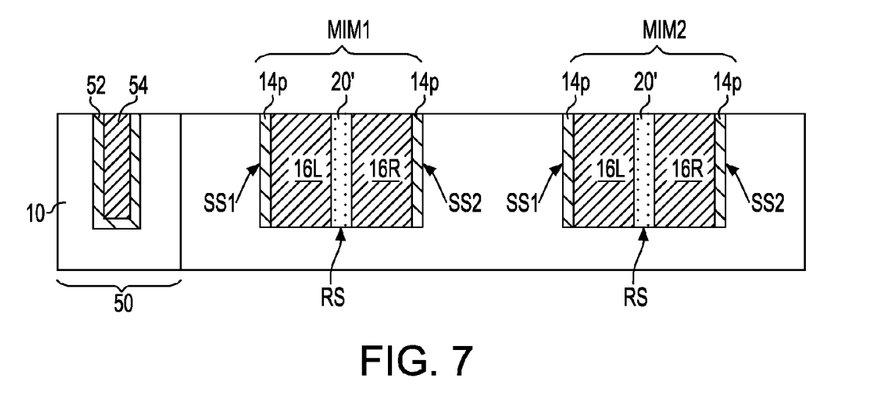
FIG. 7 is a pictorial representation (through a cross sectional view) illustrating the structure of FIG. 6 after performing a planarization process.
Figure 8:
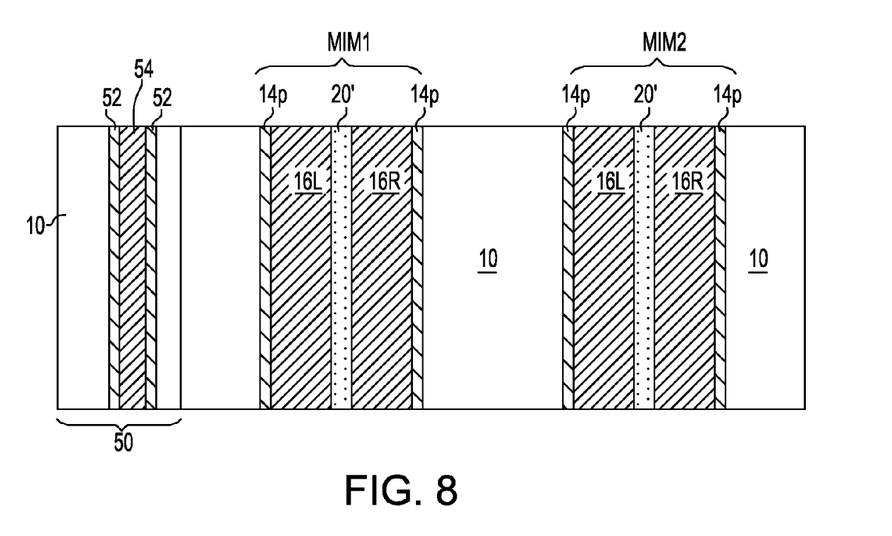
FIG. 8 is a top-down view of the structure shown in FIG. 7.

It should be noted that FIG. 1, and FIGS. 2-6 that follow, illustrate an area in which a horizontal metal-insulator-metal (MIM) capacitor of the present application will be processed. Other areas to the periphery of the area shown in FIG. 1, and FIGS. 2-6 that follow, can be processed to include a back-of-the-line structure. FIGS. 7-8 show an area of the at least one layer of dielectric material 10 in which a back-end-of-the-line structure can be formed. By "back-of-the-line structure" it is meant any interconnect metal-containing structure, such as a Cu interconnect structure, that is embedded with the same level of the at least one layer of dielectric material 10 as the horizontal metal-insulator-metal (MIM) capacitor of the present application.

Figure 2:
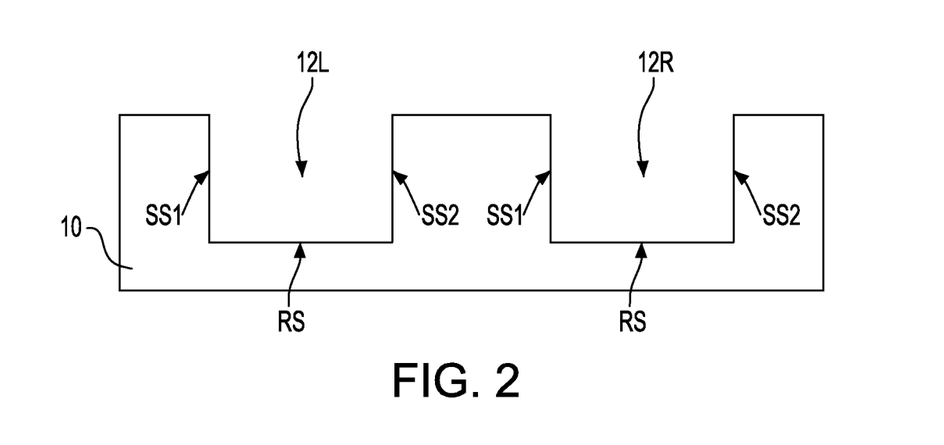
FIG. 2 is a pictorial representation (through a cross sectional view) illustrating the structure of FIG. 1 after forming at least one opening within the at least one layer of dielectric material.

Referring now to FIG. 2, there is shown the structure of FIG. 1 after forming at least one opening 12L, 12R within the at least one layer of dielectric material 10. Each opening 12L, 12R exposes two sidewall surfaces SS1, SS2 of the at least one layer of dielectric material 10 that extend to a common recessed surface RS of the at least one layer of dielectric material 10. As shown in FIG. 2, the recessed surface of the at least one layer of dielectric material 10 is vertically offset and located beneath a topmost surface of the at least one layer of dielectric material 10. Although the drawings illustrate the formation of two openings 12L, 12R within the at least one layer of dielectric material 10, the present application is not limited to only forming two openings into the at least one layer of dielectric material. Instead, a single opening or plurality of (i.e., two or more) openings can be formed into the layer of dielectric material 10.

In one embodiment of the present application and when a plurality of openings 12L, 12R is formed, each corresponding opening can have a same depth. In another embodiment and when a plurality of openings 12L, 12R is formed, each corresponding opening can have a different depth. In yet another embodiment of the present application and when a plurality of openings 12L, 12R is formed, a first set of openings can have a first depth and a second set of openings can have a second depth wherein the second depth is different from, i.e., greater than or less than, the first depth. In any of the aforementioned embodiments, the depth is measured from the topmost surface of the at least one layer of dielectric material to the recessed surface RS of the at least one layer of dielectric material 10 provided by each opening.

As shown in FIG. 2, the recessed surface RS provided by the at least one opening 12L, 12R does not extend entirely through the at least one layer of dielectric material 10.

The at least one opening 12L, 12R can be formed into the at least one layer of dielectric material 10 utilizing lithography and etching. The lithographic process can include forming a photoresist (not shown) on an exposed topmost surface of at least one layer of dielectric material 10, exposing the photoresist to a desired pattern of radiation and developing the exposed photoresist utilizing a conventional resist developer. The pattern is then transferred into the underlying at least one layer of dielectric material 10 by etching. The etching can include a dry etching process (such as, for example, reactive ion etching, ion beam etching, plasma etching or laser ablation), and/or a wet chemical etching process. Typically, reactive ion etching is used in providing the at least one opening 12L, 12R. After patterning the at least one layer of dielectric material 10, the patterned photoresist can be removed utilizing a conventional stripping process such as, for example, ashing.

In one embodiment and prior to patterning at least one layer of dielectric material 10, a hard mask (not shown) can be formed directly on an exposed topmost surface of the at least one layer of dielectric material 10. When employed, the hard mask can include an oxide, a nitride, an oxynitride or any multilayered combination thereof. In one embodiment, the hard mask is composed of an oxide such as silicon dioxide, while in another embodiment the hard mask is composed of a nitride such as silicon nitride. The hard mask can be formed utilizing a deposition process including, for example, chemical vapor deposition (CVD), plasma enhanced chemical vapor deposition (PECVD), chemical solution deposition, evaporation, or physical vapor deposition (PVD). Alternatively, the hard mask can be formed by one of thermal oxidation, and thermal nitridation. When employed, the thickness of the hard mask is from 5 nm to 100 nm. Other thicknesses that are greater than or lesser than the thickness range mentioned above can also be employed for the hard mask.

When a hard mask is present, a first etch is performed to transfer the pattern provided in the photoresist to the hard mask, the patterned photoresist can then removed by an ashing step, and thereafter, a second etch is performed to transfer the pattern from the patterned hard mask into the at least one layer of dielectric material 10. In embodiments in which a hard mask is present, the hard mask can be removed from atop the at least one layer of dielectric material 10 after the at least opening 12L, 12R is formed into the at least one layer of dielectric material 10. In such an embodiment, a planarization process such as, for example, chemical mechanical polishing and/or grinding can be used to removed remaining portions of hard mask from atop the at least one layer of dielectric material 10.

The at least one opening 12L, 12R that is formed into the at least one layer of dielectric material 10 is typically a via opening. In some embodiments of the present application, the width of each opening 12L, 12R, as measured from one sidewall surface (e.g., SS1) of the at least one layer of dielectric material 10 to an opposing sidewall surface (e.g., SS2) of the at least one layer of dielectric material 10, may be the same. In other embodiments of the present application, the width of each opening 12L, 12R, as measured from one sidewall surface (e.g., SS1) of the at least one layer of dielectric material 10 to an opposing sidewall surface (e.g., SS2) of the at least one layer of dielectric material 10, may be different. In yet other embodiments of the present application, the width of a first set of openings, as measured from one sidewall surface (e.g., SS1) of the at least one layer of dielectric material 10 to an opposing sidewall surface (e.g., SS2) of the at least one layer of dielectric material 10, may be the same, while the width of a second set of openings, as measured from one sidewall surface (e.g., SS1) of the at least one layer of dielectric material 10 to an opposing sidewall surface (SS2) of the at least one layer of dielectric material 10, may be different. In any of embodiments, the width of the at least one opening 12L, 12R can be in a range from 50 nm to 200 nm. Other widths that are lesser than or greater than the aforementioned range can also be employed in the present application.

Figure 3:
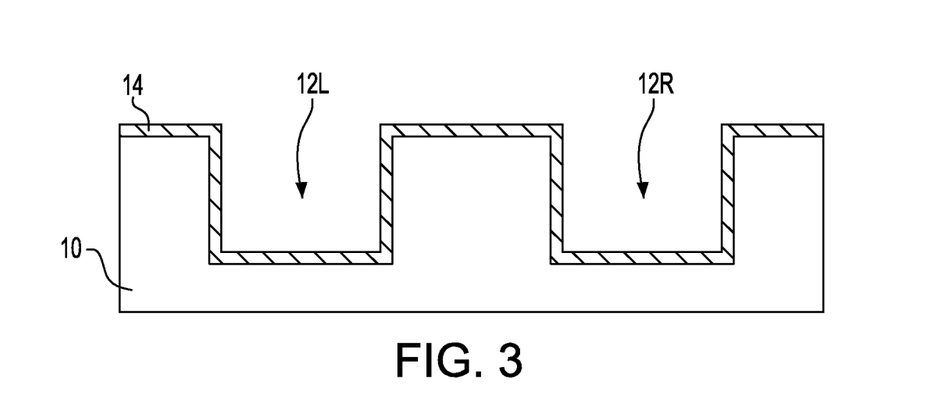
FIG. 3 is a pictorial representation (through a cross sectional view) illustrating the structure of FIG. 2 after forming a layer of a diffusion barrier material on all exposed surfaces of the at least one layer of dielectric material including within the at least one opening.

Referring now to FIG. 3, there is illustrated the structure of FIG. 2 after forming a layer of a diffusion barrier material 14 on exposed surfaces of the at least one layer of dielectric material 10 including within the at least one opening 12L, 12R. That is, a contiguous layer of a diffusion barrier material 14 is formed on the exposed topmost surface of the at least one layer of dielectric material 10, on exposed sidewall surfaces (SS1, SS2) of the at least one layer of dielectric material within each opening 12L, 12R and along the recessed surface RS of the at least one layer of dielectric material provided by each opening 12L, 12R.

The terms "contiguously" or "contiguous" denotes that a particular layer such as, for example, the layer of diffusion barrier material 14, does not include any breaks therein. The layer of diffusion barrier material 14 does not completely fill each opening 12L, 12R, but rather the layer of diffusion barrier material 14 is present along the sidewall surfaces SS1, SS2 and the recessed surface RS of the at least one layer of dielectric material 10 in each opening 12L, 12R.

The layer of diffusion barrier material 14 can include Co, CoN, Ir, Pt, Pd, Ta, TaN, Ti, TiN, Ru, RuN, RuTa, RuTaN, W, WN or any other material that can serve as a barrier to prevent a conductive material from diffusing there through. The thickness of the layer of diffusion barrier material 14 may vary depending on the deposition process used as well as the material employed. In one example, the layer of diffusion barrier material 14 may have a thickness from 1 nm to 50 nm. In another example, the layer of diffusion barrier material 14 may have a thickness from 5 nm to 20 nm.

The layer of diffusion barrier material 14 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 4:
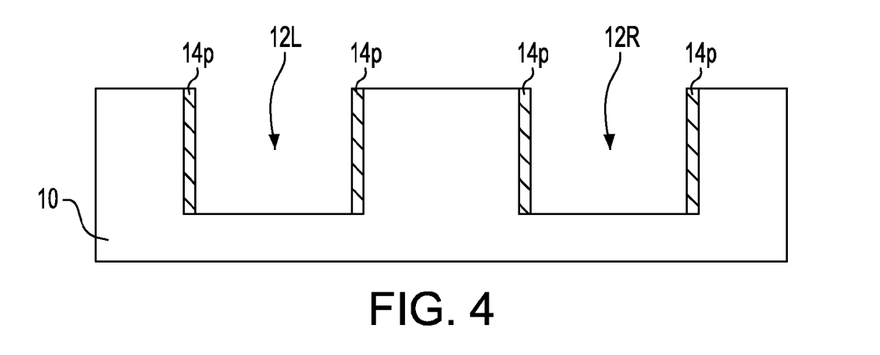
FIG. 4 is a pictorial representation (through a cross sectional view) illustrating the structure of FIG. 3 after removing portions of the layer of diffusion barrier material from all horizontal surfaces of the at least one layer of dielectric material, while maintaining a diffusion barrier material portion on exposed sidewall surfaces of the at least one layer of dielectric material in the at least one opening.

Referring now to FIG. 4, there is illustrated the structure of FIG. 3 after removing portions of the layer of diffusion barrier material 14 from all horizontal surfaces of the at least one layer of dielectric material 10 (including the topmost surface of the at least one dielectric material and from the recessed surface RS of the at least one layer of dielectric material 10 provided by the at least one opening 12L, 12R), while maintaining a diffusion barrier material portion 14p on exposed sidewall surfaces SS1, SS2 of the at least one dielectric material 10 in the at least one opening 12L, 12R. The diffusion barrier material portion 14p that remains comprises a same material as the layer of diffusion barrier material 14 mentioned above.

The structure shown in FIG. 4 can be formed by subjecting the structure shown in FIG. 3 to a directional etching process which removes a selected material, i.e., the diffusion barrier material, from all horizontal surfaces of a structure, while maintaining a portion of the selected material, i.e., the diffusion barrier material, on all vertical surfaces of the structure. In one embodiment of the present application the directional etching process that can be used in providing the structure shown in FIG. 4 includes a sputter etching process. In one example, sputter etching can be performed utilizing an argon plasma.

Figure 5:
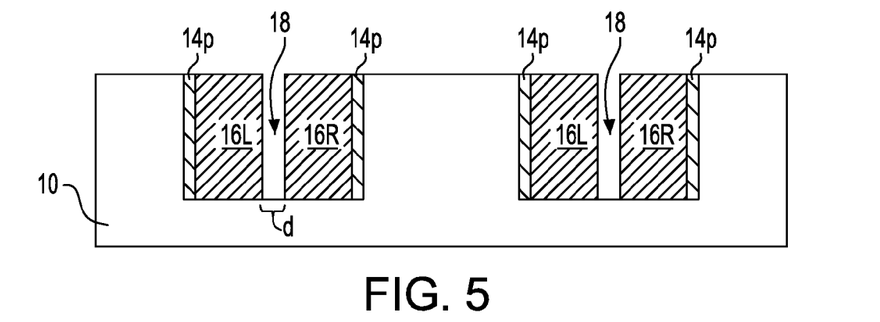
FIG. 5 is a pictorial representation (through a cross sectional view) illustrating the structure of FIG. 4 after selectively forming a metal spacer on each sidewall surface of the diffusion barrier material portion within the at least one opening, wherein a gap is present in the at least one opening and located between each metal spacer in the at least one opening.

Referring now to FIG. 5, there is illustrated the structure of FIG. 4 after selectively forming a metal spacer 16L, 16R on each exposed sidewall surface of the diffusion barrier material portion 14p within each opening 12L, 12R, wherein a gap 18 is present in each opening 12L, 12R and located between each metal spacer 16L, 16R. Stated in other terms, FIG. 5 illustrates a structure in which a pair of spaced apart metal spacers 16L, 16R is provided in each opening 12L, 12R. In accordance with the present application, the metal spacers 16L, 16R that are formed into each opening 12L, 12R will be used as metal plates of a horizontal MIM capacitor of the present application.

As shown in FIG. 5, a bottommost surface of each metal spacer 16L, 16R within each opening 12L, 12R is in direct contact with the recessed surface RS of the at least one layer of dielectric material 10. As also shown in FIG. 5, each metal spacer 16L, 16R has a topmost surface that is coplanar with a topmost surface of the diffusion barrier material portions 14p and a topmost surface of the at least one layer of dielectric material 10. As is further shown in FIG. 5, portions of the recessed surface RS remain bare after forming metal spacer 16L and metal spacer 16R into each opening 12L, 12R.

The metal spacers 16L, 16R that are employed in the present application can include any metal or metal alloy that can be employed as a metal plate of a capacitor. In one embodiment of the present application, each metal spacer 16L, 16R that is formed can include a metal or metal alloy. Examples of such metals or metal alloys that can be used as the material of metal spacers 16L, 16R include, but are not limited to, Cu Ru, Ir, Rh, Mn, Pt, Co, W or alloys thereof. In another example, a Co(W, P, B) alloy can be used as a material for the metal spacers 16L, 16R. In some embodiments, each metal spacer may comprise a single layer of metal or metal alloy. In other embodiments, each metal spacer may comprise a plurality of metal or metal alloy layers. In some cases, Co is selected as the material for each metal spacer 16L, 16R.

In some embodiments, a block mask may be used to protect a first set of openings, while leaving a second set of openings unprotected. A pair of metal spacers each comprising a first metal or metal alloy may be formed into the second set of openings. The block mask can then be removed from the first set of openings, and then another block mask is formed over the areas including the second set of openings. A pair of metal spacers each comprising a second metal or metal alloy which differs from the first metal or metal alloy may be formed into the first set of openings and thereafter the another block mask can be removed. The usage of block mask technology thus permits the formation of metal spacers 16L, 16R within one set of openings that comprise a different metal or metal alloy than metal spacers 16L, 16R that are formed within a second set of openings. For example, the metal spacers 16L, 16R in opening 12L may comprise Co, while the metal spacers 16L, 16R in opening 12R may comprise Ru.

The pair of metal spacers 16L, 16R that are provided into each opening 12L, 12R can be formed by a selective deposition process in which the metal or metal alloy used in providing each metal spacer 16L, 16R grows laterally from the sidewall surfaces of each diffusion barrier material portion 14p within each opening 12L, 12R. Examples of selective deposition processes that can be used in forming the metal spacers 16L, 16R include, but are not limited to, CVD, PECVD, ALD or electroless deposition.

In some embodiments, the metal spacers 16L, 16R can be formed utilizing a low temperature chemical deposition process including, for example, CVD, PECVD, low pressure (i.e., a pressure of 20 torr or less) CVD, ALD or electroless deposition. By "low temperature", it is meant a deposition temperature of from 75° C. up to, and including, 200° C. In some embodiments, the low temperature deposition conditions are selected to provide a deposition rate of the metal spacers onto the sidewall surface of the diffusion barrier material portions 14p that is from 0.2 Å/sec to 0.8 Å/sec.

The gap 18 that is provided between each metal spacer 16L, 16R within each opening 12L, 12R spaces apart metal spacer 16L from metal spacer 16R by a distance, d. The distance, d, between metal spacer 16L and 16R is less than the lithographic limit of conventional lithography which as of the filing date of the present application is 50 nm. In one embodiment of the present application, the distance, d, between metal spacer 16L and metal spacer 16R within each gap 18 is from 1 to 10 nm. In another embodiment of the present application, the distance, d, between metal spacer 16L and metal spacer 16R within each gap 18 is from greater than 10 nm to less than 40 nm.

Figure 6:
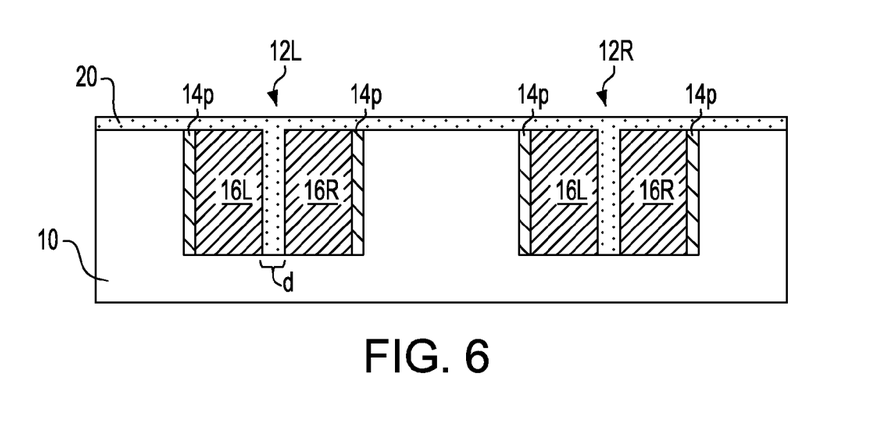
FIG. 6 is a pictorial representation (through a cross sectional view) illustrating the structure of FIG. 5 after forming a dielectric material having a dielectric constant of greater than silicon dioxide in the gap and on exposed topmost surfaces of each diffusion barrier material portion and on the at least one layer of dielectric material.

Referring now to FIG. 6, there is illustrated the structure of FIG. 5 after forming a dielectric material 20 having a dielectric constant of greater than silicon dioxide in the gap 18 and on exposed topmost surfaces of each diffusion barrier material portion 14p and on an exposed topmost surface of the at least one layer of dielectric material 10. The dielectric material 20 serves as a capacitor dielectric material that laterally separates metal spacer 16L from metal spacer 16R within each opening 12L, 12R.

Exemplary dielectric materials having a dielectric constant of greater than silicon dioxide that can be employed in the present application as dielectric material 20 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, $TaO_5$, $Si_3N_4$, $PSiN_x$, $TaO_2$, a silicate thereof, or an alloy thereof. Each value of x is independently from 0.5 to 3 and each value of y is independently from 0 to 2.

The dielectric material 20 having a dielectric constant of greater than silicon dioxide can be formed chemical vapor deposition (CVD), plasma enhanced chemical vapor deposition (PECVD), or atomic layer deposition (ALD).

Referring now to FIG. 7, there is illustrated the structure of FIG. 6 after performing a planarization process. FIG. 8 is a top-down view showing the structure of FIG. 7. In some embodiments of the present application, the planarization step can be omitted. The dielectric material 20 that remains within each gap 18 of each of the openings 12L, 12R can be referred to herein as dielectric material portion 20'. Also, shown in FIGS. 7 and 8 is an area 50 of the least one layer of dielectric material 10 in which an interconnect structure is formed. The interconnect structure includes a diffusion barrier liner 52 and a conductive metal 54. The diffusion barrier liner 52 can include one of the materials mentioned above for the layer of diffusion material 14. The conductive metal 54 may include any conductive metal typically used in interconnect structures. Examples include Cu, Al or an AlCu alloy. At least the opening and the diffusion barrier liner 52 of the interconnect structure can be formed at the same time as those used in providing the structures shown in FIGS. 2 and 3. Block mask technology can be used to form the conductive metal 54 in the area of the at least one layer of dielectric material 10.

In the embodiment illustrated in FIG. 7, planarization can be performed by chemical mechanical polishing and/or grinding. In some instances, the planarization process can include an etch back process. As shown in FIG. 7, the planarization process provides a planar structure including a MIM capacitor in each opening 12L, 12R. Each MIM capacitor (labeled as MIM1 and MIM2 in drawings) includes dielectric material portion 20' positioned laterally between metal spacer 16L and metal spacer 16R. One of the diffusion barrier material portions 14p within an individual opening separates a sidewall surface of metal spacer 16L from a sidewall surface SS1 of the at least one layer of dielectric material 10, and another diffusion barrier material portion 14p within the same individual opening separates a sidewall surface of metal spacer 16R from a sidewall surface SS2 of the at least one layer of dielectric material 10.

The planarization process also provides a planar structure including a MIM capacitor in each opening 12L, 12R in which the topmost surface of each of the dielectric material portion 20', the metal spacer 16L, the metal spacer 16R, and diffusion barrier material portions 14p are coplanar with a topmost surface of the at least one layer of dielectric material 10. As is also shown in FIG. 7, the bottommost surface of each of the dielectric material portion 20', the metal spacer 16L, the metal spacer 16R, and diffusion barrier material portions 14p within each opening is in direct physical contact with the recessed surface of the at least one layer of dielectric material 10.

Notably, FIGS. 7-8 illustrate a semiconductor structure of the present application which includes a horizontal metal-insulator-metal capacitor (MIM1 or MIM 2) located within an opening (12L or 12R) present in at least one layer of dielectric material 10. The metal-insulator-metal capacitor within the opening includes a diffusion barrier material portion 14p present on each sidewall surface SS1, SS2 of the at least one layer of dielectric material 10 within the opening and in contact with some, but not all, of a recessed surface RS of the at least one layer of dielectric material 10 within the opening. The MIM capacitor of the present application also includes a metal spacer 16L, 16L located on a sidewall surface of each diffusion barrier material portion 14p present within the opening. The MIM capacitor of the present application further includes a dielectric material portion 20' located between each metal spacer 16L, 16R and in direct contact with a sidewall surface of each metal spacer 16L, 16R present in the opening.

FIGS. 7-8 also illustrate at least one other horizontal metal-insulator-metal capacitor (the other of MIM1 or MIM2) located within another opening (the other of 12L or 12R) present in the at least one layer of dielectric material 10. The horizontal metal-insulator-metal capacitor located within the another opening includes the same basic components as the previously described horizontal MIM capacitor of the present application.

Figure 9:
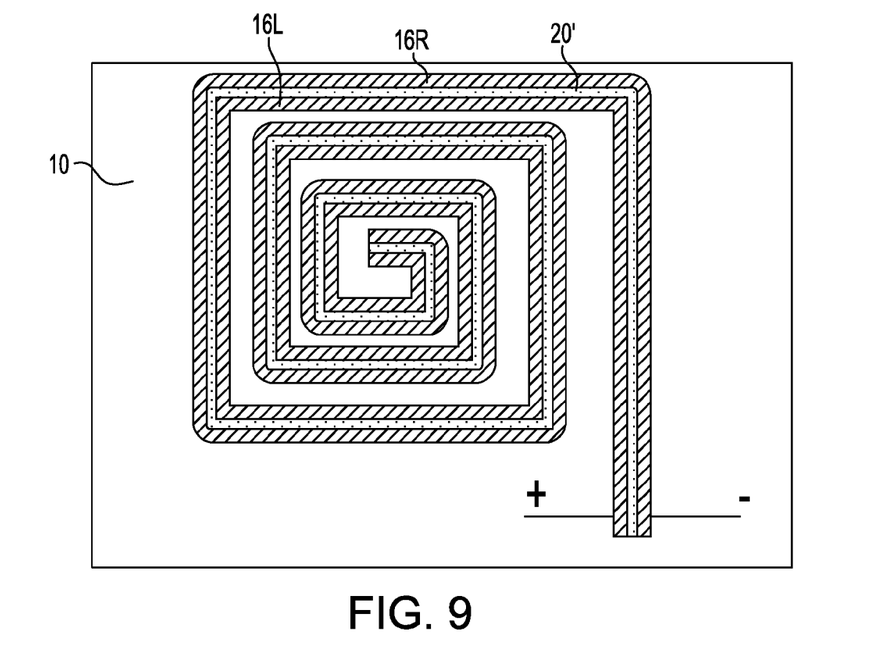
FIG. 9 is another top-down view of another structure that can be formed utilizing the processing of the present application.

Referring now to FIG. 9, there is illustrated another top-down view of another structure that can be formed utilizing the processing of the present application. The structure shown in FIG. 9 includes a MIM capacitor within a single opening in which the opening has a coiled pattern.

Figure 10:
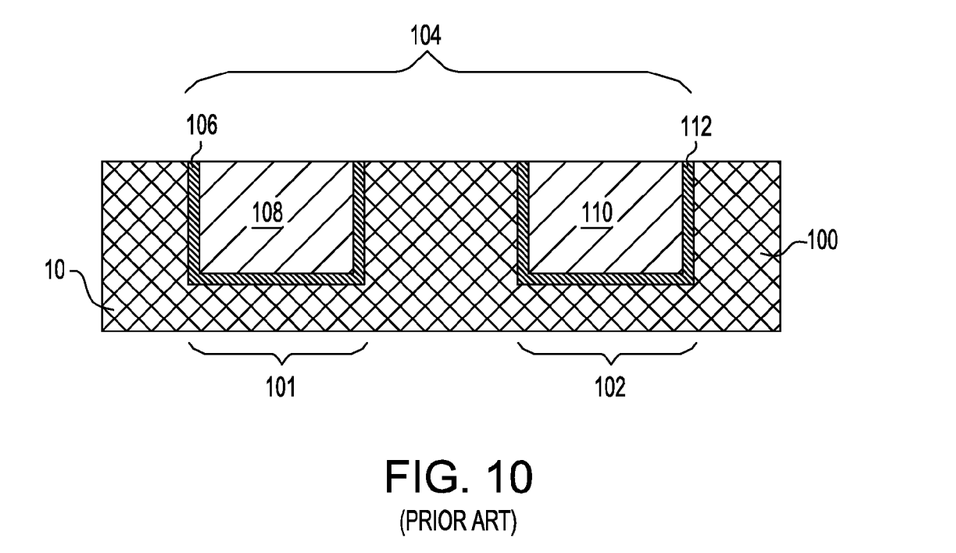
FIG. 10 is a pictorial representation (through a cross sectional view) depicting a prior art MIM capacitor structure in which two openings are required to form a single MIM capacitor.

Referring now to FIG. 10, there is illustrated a prior art MIM capacitor structure in which two openings 101, 102 are present within a dielectric material 100 and are required to form a single MIM capacitor 104. The single capacitor 104 within the prior art structure includes first metal plate 108 within a first opening 101 that is lined on the sidewall surfaces and recessed surface with a diffusion barrier material 106, and a second metal plate 110 within a second opening that is lined on the sidewall surfaces and recessed surface with another diffusion barrier material 112. In the prior art structure, a portion of the dielectric material 100 (labeled as 100P in FIG. 10) which is located between the first and second openings 101, 102 serves as the insulator of the prior art capacitor.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a horizontal metal-insulator-metal capacitor located within an opening present in at least one layer of dielectric material, wherein said metal-insulator-metal capacitor comprises:

a diffusion barrier material portion present on each sidewall surface of the at least one layer of dielectric material within the opening and in contact with some, but not all, of a recessed surface of the at least one layer of dielectric material within said opening, a metal spacer located on a sidewall surface of each diffusion barrier material portion present within the opening, and a dielectric material portion located between each metal spacer and in direct contact with a sidewall surface of each metal spacer present in the opening.

2. The semiconductor structure of claim 1, wherein bottommost surfaces of each diffusion barrier material portion, each metal spacer and said dielectric material portion present in the opening is in contact with said recessed surface of the at least one layer of dielectric material.

3. The semiconductor structure of claim 1, wherein topmost surfaces of each diffusion barrier material portion, each metal spacer and said dielectric material portion present in the opening are coplanar with a topmost surface of the at least one layer of dielectric material.

4. The semiconductor structure of claim 1, wherein said dielectric material portion is present in a gap located between each metal spacer present in the opening, wherein said gap defines a distance between one sidewall surface of one of the metal spacers to another sidewall surface of another of the metal spacers.

5. The semiconductor structure of claim 4, wherein said distance is less than 50 nm.

6. The semiconductor structure of claim 4, wherein said distance is from 1 nm to 10 nm.

7. The semiconductor structure of claim 1, wherein each diffusion barrier material portion present in the opening is comprised of at least one of Co, CoN, Ir, Pt, Pd, Ta, TaN, Ti, TiN, Ru, RuN, RuTa, RuTaN, W, and WN.

8. The semiconductor structure of claim 1, wherein each metal spacer is comprised of Cu, Ru, Ir, Rh, Mn, Pt, Co, W, or alloys of Cu, Ru, Ir, Rh, Mn, Pt, Co, or W.

9. The semiconductor structure of claim 1, wherein dielectric material portion comprises a dielectric material having a dielectric constant of greater than silicon dioxide.

10. The semiconductor structure of claim 1, further comprising at least one other horizontal metal-insulator-metal capacitor located within another opening present in that at least one layer of dielectric material, wherein said at least one other metal-insulator-metal capacitor comprises:

another diffusion barrier material portion present on each sidewall surface of the at least one layer of dielectric material within the another opening and in contact with some, but not all, of another recessed surface of the at least one layer of dielectric material within said another opening, another metal spacer located on a sidewall surface of each another diffusion barrier material portion present within the another opening, and another dielectric material portion located between each another metal spacer and in direct contact with a sidewall surface of each another metal spacer present in the another opening.

11. The semiconductor structure of claim 10, wherein said at least one other horizontal metal-insulator-metal capacitor and said horizontal metal-insulator-metal capacitor are separated by a portion of said at least one layer of dielectric material.

12. A method of forming a semiconductor structure comprising:

providing at least one opening within at least one layer of dielectric material;

forming a diffusion barrier material portion on each sidewall surface of the at least one layer of dielectric material within each opening and in contact with some, but not all, of a recessed surface of the at least one layer of dielectric material within each opening;

forming a metal spacer on a sidewall surface of each diffusion barrier material portion present within each opening, wherein each metal spacer in each opening is separated by a gap; and filling said gap with a dielectric material.

13. The method of claim 12, wherein said forming the diffusion barrier material portion comprises:

forming a layer of diffusion barrier material on each sidewall surface and an entirety of the recessed surface of the at least one layer of dielectric material within each opening; and performing a directional etching process.

14. The method of claim 13, wherein said directional etching process comprises a sputter etch.

15. The method of claim 12, wherein said metal spacer comprises a selective deposition process in which a metal or metal alloy grows laterally from a sidewall surface of each diffusion barrier material portion present within each opening.

16. The method of claim 15, wherein said selective deposition process is performed at a deposition temperature from 75° C. up to, and including, 200° C.

17. The method of claim 12, wherein said gap defines a distance between one sidewall surface of one of the metal spacers to another sidewall surface of another of the metal spacers in each opening, wherein said distance is less than 50 nm.

18. The method of claim 12, further comprising performing a planarization process which forms a dielectric material portion in said gap.

19. The method of claim 18, wherein bottommost surfaces of each diffusion barrier material portion, each metal spacer and said dielectric material portion present in each opening is in contact with said recessed surface of the at least one layer of dielectric material, and wherein topmost surfaces of each diffusion barrier material portion, each metal spacer and said dielectric material portion present in each opening are coplanar with a topmost surface of the at least one layer of dielectric material.

* * * * *